United States Patent
Smith

(10) Patent No.: US 11,682,744 B2
(45) Date of Patent: Jun. 20, 2023

(54) SOLAR CELLS HAVING HYBRID ARCHITECTURES INCLUDING DIFFERENTIATED P-TYPE AND N-TYPE REGIONS

(71) Applicant: SunPower Corporation, San Jose, CA (US)

(72) Inventor: David D. Smith, Campbell, CA (US)

(73) Assignee: Maxeon Solar Pte. Ltd., Singapore (SG)

(*) Notice: Subject to any disclaimer, the term of this patent is extended or adjusted under 35 U.S.C. 154(b) by 206 days.

(21) Appl. No.: 16/586,509

(22) Filed: Sep. 27, 2019

(65) Prior Publication Data

US 2020/0105956 A1 Apr. 2, 2020

Related U.S. Application Data

(60) Provisional application No. 62/739,077, filed on Sep. 28, 2018.

(51) Int. Cl.
*H01L 31/068* (2012.01)
*H01L 31/18* (2006.01)
(Continued)

(52) U.S. Cl.
CPC .......... *H01L 31/068* (2013.01); *H01L 31/028* (2013.01); *H01L 31/02366* (2013.01); *H01L 31/182* (2013.01)

(58) Field of Classification Search
CPC ......... H01L 31/022441; H01L 31/0516; H01L 31/0682
See application file for complete search history.

(56) References Cited

U.S. PATENT DOCUMENTS 9,196,758 B2 * 11/2015 Rim .................. H01L 31/02363
9,502,601 B1 * 11/2016 Smith ............... H01L 31/02167
(Continued)

FOREIGN PATENT DOCUMENTS

KR  10-2010-0136542  12/2010
KR  10-2016-0139008  12/2016

OTHER PUBLICATIONS

International Preliminary Report on Patentability from Patent Application No. PCT/US2019/053678 dated Apr. 8, 2021, 8 pgs.
(Continued)

*Primary Examiner* — Daniel P Malley, Jr.
(74) *Attorney, Agent, or Firm* — Schwabe, Williamson & Wyatt, P.C.

(57) ABSTRACT

A solar cell, and methods of fabricating said solar cell, are disclosed. The solar cell can include a substrate having a light-receiving surface and a back surface. The solar cell can include a first semiconductor region of a first conductivity type disposed on a first dielectric layer, wherein the first dielectric layer is disposed on the substrate. The solar cell can also include a second semiconductor region of a second, different, conductivity type disposed on a second dielectric layer, where a portion of the second thin dielectric layer is disposed between the first and second semiconductor regions. The solar cell can include a third dielectric layer disposed on the second semiconductor region. The solar cell can include a first conductive contact disposed over the first semiconductor region but not the third dielectric layer. The solar cell can include a second conductive contact disposed over the second semiconductor region, where the second conductive contact is disposed over the third dielectric layer and second semiconductor region. In an embodiment, the third dielectric layer can be a dopant layer.

8 Claims, 9 Drawing Sheets

(51) Int. Cl.
*H01L 31/028* (2006.01)
*H01L 31/0236* (2006.01)

(56) References Cited

U.S. PATENT DOCUMENTS

| | | | |
|---|---|---|---|
| 9,525,083 B2* | 12/2016 | Westerberg | H01L 31/02167 |
| 2011/0097840 A1* | 4/2011 | Ramappa | H01L 31/022441 |
| | | | 438/87 |
| 2011/0120534 A1 | 5/2011 | Tsai | |
| 2013/0164879 A1 | 6/2013 | Cousins et al. | |
| 2014/0020752 A1 | 1/2014 | Arimoto et al. | |
| 2014/0020756 A1* | 1/2014 | Goto | H01L 31/022441 |
| | | | 438/96 |
| 2014/0096821 A1* | 4/2014 | Chen | H01L 31/0747 |
| | | | 136/256 |
| 2014/0360567 A1* | 12/2014 | Seutter | H01L 31/022441 |
| | | | 136/256 |
| 2015/0075595 A1* | 3/2015 | Gall | H01L 31/1804 |
| | | | 136/255 |
| 2015/0372172 A1* | 12/2015 | Kimoto | H01L 31/03762 |
| | | | 136/256 |
| 2017/0222072 A1 | 8/2017 | Rim et al. | |
| 2018/0277701 A1* | 9/2018 | Lenes | H01L 31/1804 |

OTHER PUBLICATIONS

International Search Report and Written Opinion from Patent Application No. PCT/US2019/053678 dated Jan. 17, 2020, 12 pgs.

* cited by examiner

SOLAR CELLS HAVING HYBRID ARCHITECTURES INCLUDING DIFFERENTIATED P-TYPE AND N-TYPE REGIONS

CROSS-REFERENCE TO RELATED APPLICATIONS

This application claims the benefit of U.S. Provisional Application No. 62/739,077, filed on Sep. 28, 2018, the entire contents of which are hereby incorporated by reference herein.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

DETAILED DESCRIPTION

Figure 1:
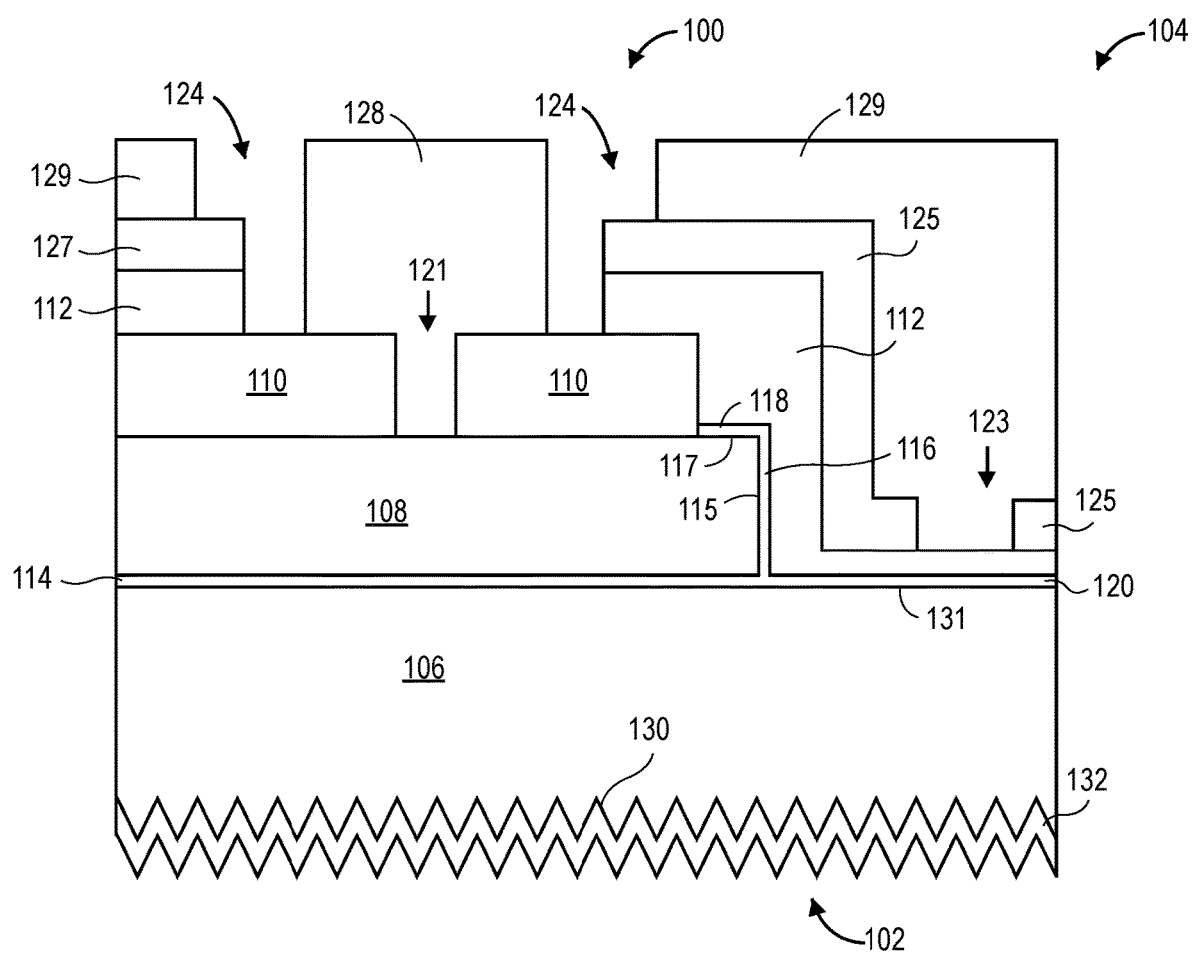
FIG. 1 illustrates a cross-sectional view of a portion of a solar cell, according to some embodiments.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" semiconductor region does not necessarily imply that this semiconductor region is the first semiconductor region in a sequence; instead the term "first" is used to differentiate this semiconductor region from another semiconductor region (e.g., a "second" semiconductor region). As used herein, a semiconductor region can be a polycrystalline silicon emitter region, e.g., a polycrystalline silicon doped with a P-type or an N-type type dopant. In one example, a first semiconductor region can be a first polycrystalline silicon emitter region, where multiple polycrystalline emitter regions can be formed (e.g., a second polycrystalline silicon emitter region).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Methods of fabricating solar cell semiconductor regions and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

FIG. 1 illustrates a cross-sectional view of a portion of a solar cell 100, according to some embodiments. In an embodiment, the solar cell 100 can include a substrate 106 having a front side 102 and a back side 104, the front side 102 opposite the back side 104. In some embodiments, the front side 102 can be referred to as a front surface and the back side 104 can be referred to as a back surface. In an embodiment, the front side can have a texturized surface. A texturized surface 130 may be one which has a regular or an irregular shaped surface for scattering incoming light, decreasing the amount of light reflected off the light-receiving and/or exposed surfaces of the solar cell 100.

Referring again to FIG. 1, in one embodiment, the solar cell 100 can include a first dielectric layer 114 disposed on the back side 104 of the substrate 106. In some embodiments, the first dielectric layer 114 can be referred to as a first thin dielectric layer. In an example, the first dielectric layer 114 can be a thin oxide layer such as a tunnel dielectric layer (e.g., tunnel oxide, silicon oxynitride, silicon oxide). In an embodiment, the first dielectric layer 114 can have a thickness of approximately 2 nanometers or less.

Referring again to FIG. 1, in an embodiment, the solar cell 100 can include a first semiconductor region 108 disposed on the first dielectric layer 114. In one embodiment, the first semiconductor region 108 can be a first polycrystalline silicon emitter region. In an embodiment, the first semiconductor region can include a first conductivity type. In an example, first semiconductor region 108 can be a first polycrystalline silicon emitter region of a first conductivity type. In a specific embodiment, the first conductivity type is N-type (e.g., formed using phosphorus atoms or arsenic impurity atoms). In some embodiments, the first conductivity type can be P-type (e.g., formed using boron).

Referring again to FIG. 1, in an embodiment, the solar cell 100 can include a second dielectric layer 120 disposed on the back side 104 of the substrate 106. In an embodiment, the second dielectric layer 120 can be partially disposed 116, 118 on portions 117, 115 of the first semiconductor region 108. In some embodiments, the second dielectric layer 120 can be referred to as a second thin dielectric layer. In an example, the second dielectric layer 120 can be a thin oxide layer such as a tunnel dielectric layer (e.g., tunnel oxide, silicon oxynitride, silicon oxide). In an embodiment, the second dielectric layer 120 can have a thickness of approximately 2 nanometers or less.

Referring again to FIG. 1, in an embodiment, the portions 116, 118 can instead be referred to as another dielectric layer (e.g., a third, fourth or fifth dielectric layer, etc.). In one embodiment, the portions 116, 118 can be portions of the second dielectric layer 120. In an embodiment, the portions 116, 118 can instead be a separate and distinct layer different from the second dielectric layer 120. In an embodiment, the portions 116, 118 can instead be portions of the first dielectric layer 114. In an example, the portions 116, 118 can be the same or a different, distinct layer, from the first dielectric layer 114 and/or the second dielectric layer 120. In some embodiments, the first dielectric layer 114 and the second dielectric layer 120 can be different and distinct layers. In an embodiment, the first dielectric layer 114 and the second dielectric layer 120 can be the same dielectric layer. In an example, the first dielectric layer 114 and the second dielectric layer 120 can be a single continuous dielectric layer. In one example, the first dielectric layer 114, the second dielectric layer 120, and layers 116, 118 can be a single continuous dielectric layer.

Referring still again to FIG. 1, in an embodiment, the solar cell 100 can include a second semiconductor region 112 disposed over the back side of the solar cell 100. In an embodiment, the second semiconductor region 112 can be disposed on the second dielectric layer 120. In an embodiment, the second semiconductor region 112 can be a second polycrystalline silicon emitter region. In an embodiment, the second semiconductor region 112 can include a second conductivity type. In an example, second semiconductor region 112 can be a second polycrystalline silicon emitter region of a second conductivity type. In a specific embodiment, the second conductivity type is P-type (e.g., formed using boron impurity atoms). In an embodiment, the second conductivity type can be N-type (e.g., formed using phosphorus atoms or arsenic impurity atoms). In one embodiment, the second dielectric layer 120 can include a portion which is disposed over 118 an outer portion 117 of the first semiconductor region 108. In an embodiment, the second dielectric layer 120 can include a portion disposed laterally 116 over a lateral portion 115 of the first semiconductor region 108. In one embodiment, portions 118, 116 of the second dielectric layer 120 can be between the first semiconductor region 108 and second semiconductor region 112. In an example, the dielectric layers 116, 118 can be a boundary for the metallurgical junction between first semiconductor region 108 from second semiconductor region 112. In one example, the dielectric layer 116 can be a boundary for the metallurgical junction between the first semiconductor region 108 from second semiconductor region 112 (e.g., without dielectric layer 118). In some embodiments, the second semiconductor region is a pre-doped polycrystalline silicon emitter region. In one such embodiment, the second semiconductor region is formed having a specific conductivity type (e.g., p-type or n-type).

Referring again to FIG. 1, in an embodiment, a third dielectric layer 125 can be disposed on the second semiconductor region 112. In an embodiment, the third dielectric layer can be a dopant layer. In one embodiment, the dopant layer can have a second conductivity type. In an embodiment, the dopant layer is of the same conductivity type as the second semiconductor region 112. In an example, the dopant layer is N-type (e.g., formed using phosphorus atoms or arsenic impurity atoms). In an embodiment, the dopant layer can be P-type (e.g., formed using boron impurity atoms). In an embodiment, a portion of the second semiconductor region 112 and the dopant layer 125 can be disposed between the first and second conductive contacts 128, 129. In some embodiments, the second semiconductor region 112 and the dopant layer 125 can be aligned with an edge of the insulating layer 110. In an embodiment, the third dielectric layer 125 can be a non-continuous layer (e.g., as shown in FIG. 1). In an example, the third dielectric layer 125 can be broken into discreet portions and can still be referred to as a single dielectric layer or dopant layer. In some embodiments, the third dielectric layer need not be formed (e.g., where the second semiconductor region includes a pre-doped polycrystalline emitter region). In one embodiment, the third dielectric layer 125 can include silicon oxide, silicon oxynitride and silicon nitride. In an embodiment, the third dielectric layer 125 can include an insulator and/or an insulating material.

Referring again to FIG. 1, in an embodiment, the solar cell 100 can further include an insulating region 110 disposed on the first semiconductor region 108. In one example, the insulating region 110 can be a silicon dioxide.

Referring again to FIG. 1, in an embodiment, the solar cell 100 can include a first conductive contact 128 disposed over the first semiconductor region 108. In an embodiment, the first conductive contact 128 can be disposed through the insulating region 110, as is depicted in FIG. 1. In one embodiment, the first conductive contact 128 is disposed through a contact hole 121 in the insulating region 110.

In an embodiment, a second conductive contact 129 can be disposed over the second semiconductor region 112. In one embodiment, the second conductive contact 129 is disposed through the third dielectric layer 125. In an embodiment, the second conductive contact 129 is disposed through a contact hole 123 in the third dielectric layer 125.

In one embodiment, the first and second conductive contacts 128, 129 can include a plated metal. In an example, the first and second conductive contacts 128, 129 can include copper, tin, titanium, tungsten, and/or nickel, among other metals. In some embodiments, the first and second conductive contacts 128, 129 can include a deposited metal or a metal foil. In an example, the first and second conductive contacts 128, 129 can include aluminum or aluminum foil. In an embodiment, the first and second conductive contacts 128, 129 can include a wire, a thermally compressed wire and/or an aluminum wire.

In one embodiment, a portion 124 of the second semiconductor region 112 and/or third dielectric layer 125 can be disposed between the first conductive contact 128 and second conductive contact 129. In some embodiments, the second semiconductor region 112 and third dielectric layer 125 can instead be laterally aligned to the second conductive contact 129, e.g., not extending from the second conductive contact 129 in contrast to that shown in FIG. 1. In one embodiment, the second semiconductor region 112 and third dielectric layer 125 may not be aligned. In an example, at the portion 124, the second semiconductor region 112 can extend further from the second conductive contact 129 than third dielectric layer 125. In an embodiment, as shown at 124, the second conductive contact 129 can be formed over the first semiconductor region 108 and the second semiconductor region 112. In contrast, in some embodiments, the second conductive contact 129 can be formed over the second semiconductor region 112 only. In an embodiment, the second conductive contact 139 can be formed over the third dielectric layer 125 and the second semiconductor region 112.

Referring once again to FIG. 1, in an embodiment, the solar cell 100 further can include a fourth dielectric layer 132 disposed on the front side 102. In an embodiment the fourth dielectric layer 132 can be an anti-reflective coating (ARC) layer. In an example, the layer 132 can include silicon nitride. In an embodiment, the fourth dielectric layer 132 can include silicon oxide. In an example, an oxide layer (e.g., a tunnel oxide) can be formed on the front side 102. In an embodiment, a silicon layer can be disposed over the fourth dielectric layer 132 (e.g., over the oxide layer). In an example, the silicon layer can include amorphous silicon and/or polycrystalline silicon. In an embodiment, an antireflective layer can be disposed over the silicon layer (e.g., silicon nitride).

Referring again to FIG. 1, in some embodiments, the first semiconductor region 108 can be a N-type polycrystalline silicon emitter region. In one embodiment, the second semiconductor region 112 can be a P-type polycrystalline silicon emitter region. In an embodiment, the substrate 106 can be a N-type monocrystalline silicon substrate. In some embodiments, the second semiconductor region 112 can be a P-type polycrystalline silicon emitter region. In an embodiment, the substrate 106 can be a P-type monocrystalline silicon substrate. In an embodiment, the first dielectric layer 114, the second dielectric layer 120 and the third dielectric layer 125 can include silicon oxide. In an embodiment, insulating region 110 includes silicon dioxide. In an embodiment where the third dielectric layer 125 can include a dopant layer, the dopant layer 125 can include phosphorus or boron.

Referring again to FIG. 1, in an embodiment, the first conductive contact and/or second conductive contact 128, 129 can include a deposited metal. In an embodiment, the deposited metal can be an aluminum-based. In one such embodiment, the aluminum-based deposited metal can have a thickness approximately in the range of 0.3 to 20 microns and include aluminum in an amount greater than approximately 97% and silicon in an amount approximately in the range of 0-2%. In an example, the aluminum-based deposited metal can include copper, titanium, titanium tungsten, nickel, and/or aluminum, among other metals. In an embodiment, the aluminum-based deposited metal is formed from a blanket deposition process. In an embodiment, the aluminum-based deposited metal can be a metal seed layer. In some examples, the deposited metal can be a deposited aluminum. In one embodiment, each of the first conductive contact 128 and the second conductive contact 129 can include copper, tin, nickel, and/or aluminum, among other metals.

Referring once again to FIG. 1, in some embodiments, the first and/or second conductive contacts 128, 129 each include a metal foil. In an embodiment, the metal foil is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In another embodiment, the aluminum foil is not anodized.

Referring still again to FIG. 1, in an embodiment, first and/or second conductive contacts 128, 129 each include a conductive wire. In an embodiment, the conductive wire can include an electrically conducting material (e.g., a metal such as aluminum, copper or another suitable conductive material, with or without a coating such as tin, silver, nickel or an organic solderability protectant). In an example, the conductive wires can be bonded to the first and second semiconductor regions by a thermocompression bonding, ultrasonic bonding, or thermosonic bonding process. In an example, the conductive wires can include aluminum wires.

Figure 2:
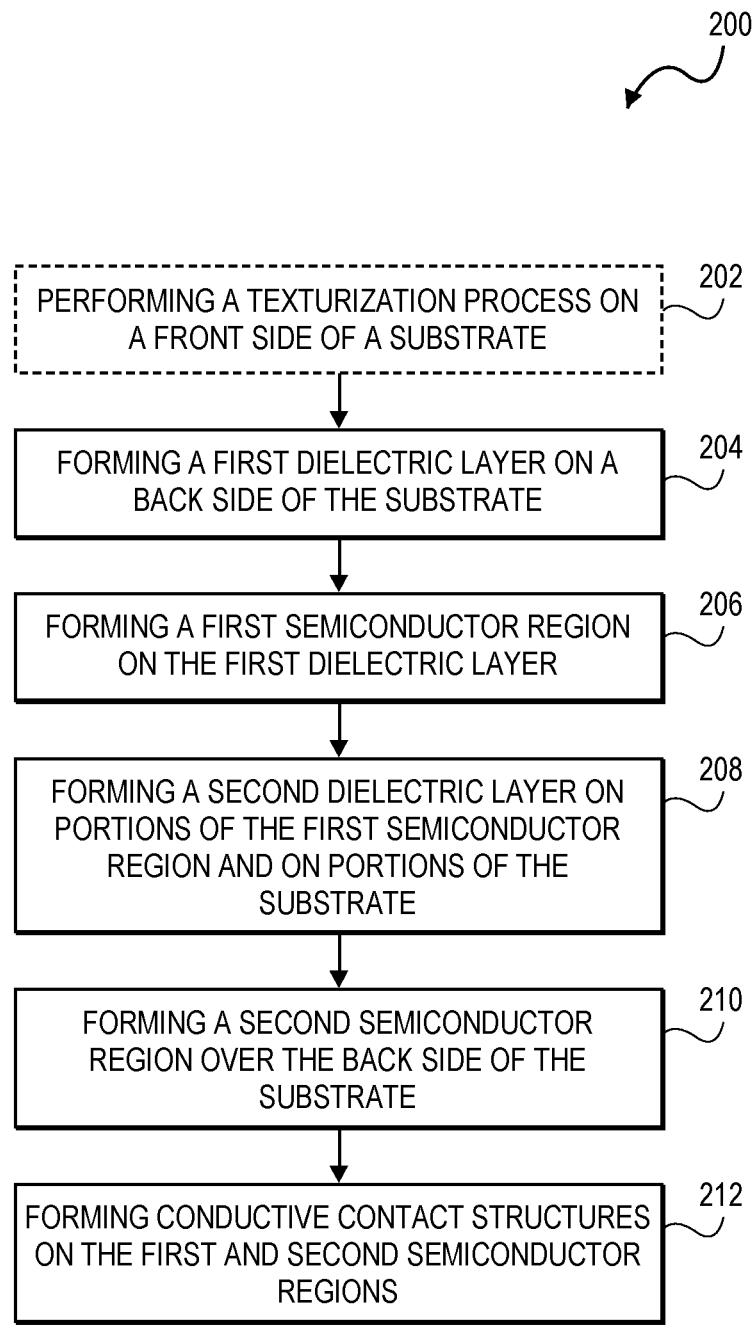
FIG. 2 is a flowchart listing operations in a method of fabricating a solar cell, according to some embodiments.

Turning to FIG. 2, a flowchart 200 illustrating a method for fabricating a solar cell is shown, according to some embodiments. In various embodiments, the method described in FIG. 2 can include additional (or fewer) blocks than illustrated.

Referring to operation 202 of flowchart 200, a method of fabricating a solar cell can include performing a texturization process on the front side of the substrate. In an example, a hydroxide-based wet etchant can be used to form a texturized surface on the front side of the substrate. It is to be appreciated, however, that the texturizing of the front side may be omitted from the process flow. In an embodiment, prior to or within the same or a single process step of the texturization process, the substrate can be cleaned, polished, planarized and/or thinned. In an example, a wet chemical clean process can be performed prior and/or subsequent to the texturization process. Although, as shown, the texturization process can be performed at the start of the fabrication process, in another embodiment, the texturization process can be performed at another step in the fabrication process. In an example, the texturization process can instead be performed subsequent to a patterning process. In one example, the texturization process can be performed prior to a thermal process. In one such example, the texturization process can be performed subsequent to a patterning (e.g., patterning of polycrystalline silicon regions) and prior to a thermal process.

In an embodiment, although operation 202 is shown to be performed prior to operation 204, operation 202 can also be performed in the middle or at the end of the method described herein. For example, operation 202 can be performed subsequent to operation 208. In one example, operation 202 can be performed after operation 210 and prior to operation 212. In an embodiment, operation 202 can be performed at the beginning, middle, end or at any other time in the process described in flow chart 202.

Referring to operation 204 of flowchart 200, a method of fabricating a solar cell can include forming a first dielectric layer on the back side of the substrate. In an embodiment, the first dielectric layer can be formed in an oxidation process and is a thin oxide layer such as a tunnel dielectric layer (e.g., silicon oxide). In one embodiment, the first dielectric layer can be formed in a deposition process. In an embodiment, the first dielectric layer is a thin oxide layer (e.g., silicon oxide) or silicon oxynitride layer. In an embodiment, forming the first dielectric layer can include forming the first dielectric layer at a thickness of approximately 2 nanometers or less. In an example, a thermal process or oven can be used to grow the first dielectric layer. As used herein, the first dielectric layer can also be referred to as a first thin dielectric layer.

Referring to operation 206 of flowchart 200, a method of fabricating a solar cell can include forming a first semiconductor region on the first dielectric layer. In an embodiment, forming a first semiconductor region can include forming a first polycrystalline silicon emitter region. In an embodiment, forming a first semiconductor region can include forming a first silicon layer on the first dielectric layer, forming an insulator layer over the first silicon layer and, subsequently, patterning the first silicon layer, insulator layer and first dielectric layer to form an insulating region and the first semiconductor region (e.g., a first polycrystalline silicon emitter region having an insulating region thereon). Further detail in operations for forming a first semiconductor region are shown in the flowchart 300 of FIG. 3 below. In an embodiment, the operation 204 and 206 can be performed in the same process step or at different, e.g., separate, process steps.

Referring to operation 208 of flowchart 200, a method of fabricating a solar cell can include forming a second dielectric layer on portions of the first semiconductor region and on portions of the substrate. In an embodiment, the second dielectric layer can be formed in an oxidation process and is a thin oxide layer such as a tunnel dielectric layer (e.g., silicon oxide). In one embodiment, the second dielectric layer can be formed in a deposition process. In an embodiment, the second dielectric layer is a thin oxide layer (e.g., silicon oxide) or silicon oxynitride layer. In an embodiment, the second dielectric layer can have a thickness of approximately 2 nanometers or less. In an example, forming the second dielectric layer on portions of the first semiconductor region and portions of the substrate can include forming the second dielectric layer on exposed portions of the first semiconductor region and on exposed portions of the substrate. In one example, the exposed regions of the first semiconductor region and the substrate can be formed after a patterning process performed at the operation of 206. As used herein, the second dielectric layer can also be referred to as a second thin dielectric layer.

Referring again to operation 208 of flowchart 200, in an embodiment, forming the second dielectric layer on portions of the first semiconductor region can instead include forming a separate, different and/or distinct dielectric layer on portions of the first semiconductor region. In an example, forming the second dielectric layer on portions of the first semiconductor region can include forming another dielectric layer on portions of the first semiconductor region. In an embodiment, this dielectric layer can be referred to as a fourth or a fifth dielectric layer.

Referring to operation 210 of flowchart 200, a method of fabricating a solar cell can include forming a second semiconductor region over a back side of a substrate. In an embodiment, forming second semiconductor region over a back side of a substrate includes forming the second semiconductor region on or over the second dielectric layer. Forming the second semiconductor region can include forming a second silicon layer on or over the second dielectric layer, forming a third dielectric layer over the second silicon layer, patterning the second silicon layer, third dielectric layer and second dielectric layer and, subsequently performing a thermal process to drive dopants from the dopant layer to the second silicon layer to form the second semiconductor region. In an embodiment, as described herein, the third dielectric layer can include a dopant layer, where patterning the second silicon layer, third dielectric layer and second dielectric layer can include patterning the second silicon layer, dopant layer and second dielectric layer. Further detail in operations for forming a second semiconductor region are shown in the flowchart 400 of FIG. 4 below.

Referring to operation 212 of flowchart 200, a method of fabricating a solar cell can include forming conductive contact structures over the first semiconductor region and the second semiconductor region. In an embodiment, forming the conductive contact structures can include performing a sputtering process, locally depositing a metal, a blanket deposition process, a plating process, bonding a metal foil and/or bonding wires to first and the second semiconductor regions. In an example, the conductive contact structures can include a locally deposited aluminum, aluminum foil and/or an aluminum wire. In an embodiment, the conductive contact structures can include one or more metals and/or metal alloys. In an example, the conductive contact structures can include aluminum, titanium tungsten and/or copper, among other metals. In an embodiment, the conductive contact structures can include one, two or more layers of metal. In an example, the conductive contact structures can include a metal seed layer. In an embodiment, the metal seed layer can include a first layer including copper, a second layer including tungsten and a third layer including aluminum.

Referring again to operation 212 of flowchart 200, a method of fabricating a solar cell can include patterning an insulating region and a third dielectric layer (e.g., a dopant layer) to expose portions of the first and second semiconductor emitter regions, where a first conductive contact and second conductive contact can be electrically connected to the exposed portions to first semiconductor region and second semiconductor region, respectively. Further detail in operations for forming conductive contact structures over the first and second semiconductor regions are shown in the flowchart 500 of FIG. 5.

Figure 3:
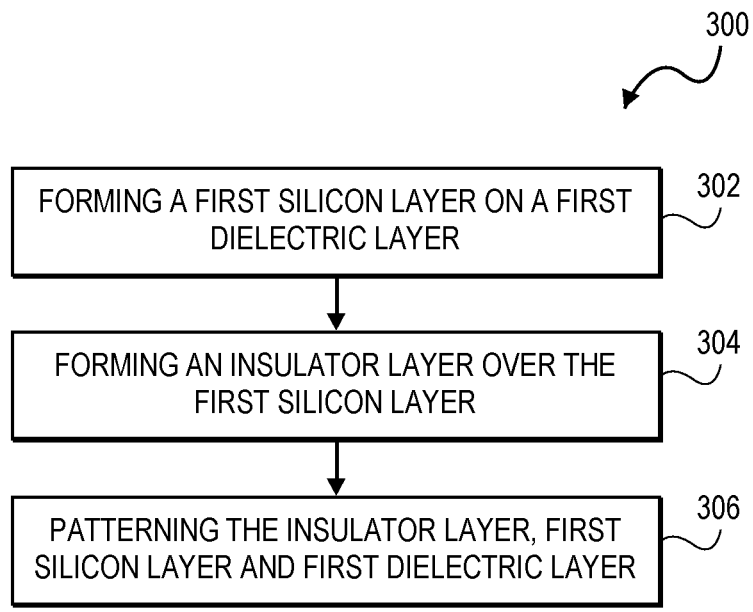
FIG. 3 is a flowchart listing operations in forming a first semiconductor region of a solar cell, according to some embodiments.

Referring to FIG. 3, a flowchart 300 illustrating operations in forming a first semiconductor region is shown, according to some embodiments. In various embodiments, the method described in FIG. 3 can include additional (or fewer) blocks than illustrated. Although one embodiment for forming a first semiconductor region (e.g., first polycrystalline emitter region) is shown below, other operations can be used. In an example, in contrast to the operations of flowchart 300, a screen printing, inkjet printing or any other process for directly depositing a patterned silicon can used to form the first semiconductor region.

Referring to operation 302 of flowchart 300, forming a first semiconductor region can include forming a first silicon layer on a first dielectric layer. In an embodiment, the first dielectric layer is formed over a back side of a substrate (e.g., a silicon substrate). In one embodiment the first dielectric layer is a thin oxide layer. In an embodiment, the first silicon layer can be deposited over the first dielectric layer. In one example, a low pressure chemical vapor deposition process can be used to deposit the first silicon layer over the first dielectric layer. In an embodiment, the first silicon layer is grown on the first dielectric layer in a thermal process and/or an oven. In one embodiment, the first dielectric layer and the first silicon layer can be formed (e.g., grown) in the same or in a single oven and/or in the same or single process step. In some embodiments, the first dielectric layer and the first silicon layer can be formed on the back side, the front side and/or side edges of the substrate, where, in a subsequent patterning (e.g., operation 306) or cleaning process can be performed to remove the first dielectric layer and the first semiconductor layer from the front side and/or side edges of the substrate.

Referring again to operation 302 of flowchart 300, forming a first semiconductor region can include, in an embodiment, forming a first silicon layer having a first conductivity type. In an example, forming the first silicon layer can include growing an N-type silicon layer over the first dielectric layer (e.g., a thin oxide layer). In other embodiments, the first silicon layer can be a P-type silicon layer. In an embodiment, the first silicon layer is an amorphous silicon layer. In one such embodiment, the amorphous silicon layer is formed using low pressure chemical vapor deposition (LPCVD) or plasma enhanced chemical vapor deposition (PECVD). In an embodiment, the first silicon layer can be an amorphous silicon and/or polycrystalline silicon. In an embodiment, the first silicon layer is grown on the first dielectric layer in a thermal process and/or an oven. In one embodiment, the first dielectric layer and the first silicon layer can be grown in the same or single oven and/or in the same or single process step.

Referring once again to operation 302 of flowchart 300, in another embodiment, the first silicon layer can be formed undoped. In one such embodiment, a dopant layer can be formed on the first silicon layer and a thermal process can be performed to drive dopants from the dopant layer into the first silicon layer resulting in a first silicon layer having a first conductivity type (e.g., n-type or p-type).

Referring to operation 304 of flowchart 300, forming a first semiconductor region can include forming an insulator layer on the first silicon layer. In an embodiment the insulator layer can include silicon dioxide. In an example, a blanket deposition process can be performed to form the insulator layer. In an embodiment, the insulator layer can be formed to a thickness less than or equal to approximately 1000 Angstroms.

Referring to operation 306 of flowchart 300, the insulator layer, first silicon layer and first dielectric layer can be patterned to form a first semiconductor region. In an embodiment, the first semiconductor region can have an insulating region formed over the first semiconductor region. In an embodiment, the insulating region can be formed from the patterning the insulator layer of operation 304. In an embodiment, a lithographic or screen print masking and subsequent etch process can be used to pattern the insulator layer and the first silicon layer. In another embodiment, a laser ablation process (e.g., direct write) can be used to pattern the insulator layer, the first silicon layer and/or the first dielectric layer.

Figure 4:
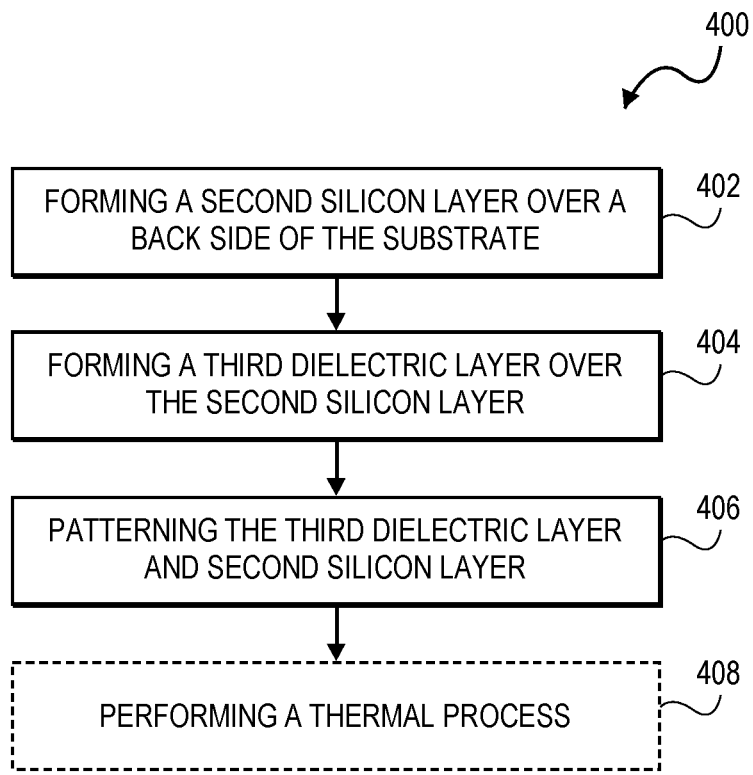
FIG. 4 is a flowchart listing operations in forming a second semiconductor region of a solar cell, according to some embodiments.

Referring to FIG. 4, a flowchart 400 illustrating operations in forming a second semiconductor region is shown, according to some embodiments. In various embodiments, the method described in FIG. 4 can include additional (or fewer) blocks than illustrated. Although one embodiment for forming a second semiconductor region (e.g., second polycrystalline emitter region) is shown below, other operations can be used. In an example, in contrast to the operations of flowchart 400, a screen printing, inkjet printing or any other process for directly depositing a patterned silicon can used to form the second semiconductor region.

Referring to operation 402 of flowchart 400, forming a second semiconductor region can include forming a second silicon layer over a back side of the substrate. In an embodiment, forming the second silicon layer over the back side of the substrate can include forming the second silicon layer on a second dielectric layer and an insulating region disposed on the back side of the substrate. In an embodiment, the second dielectric layer is formed from the operations as described above in flowchart 200 and 300. In one embodiment the second dielectric layer is a thin oxide layer. In one embodiment, the second silicon layer can be deposited over the second dielectric layer. In one example, a low pressure chemical vapor deposition process (LPCVD) or a plasma enhanced chemical vapor deposition (PECVD) can be used to deposit the second silicon layer over the second dielectric layer. In an embodiment, the second silicon layer can be a polycrystalline silicon. In an embodiment, the second silicon layer is grown on the second dielectric layer in a thermal process and/or an oven. In one embodiment, the second dielectric layer and the second silicon layer can be grown in the same or single oven and/or in the same or single process step. In an embodiment, the second silicon layer can be formed undoped. In an embodiment, the second silicon layer is an amorphous silicon layer. In one such embodiment, the amorphous silicon layer is formed using low pressure chemical vapor deposition (LPCVD) or plasma enhanced chemical vapor deposition (PECVD).

Referring again to operation 402 of flowchart 400, in another embodiment, forming a second semiconductor region can include forming a second silicon layer having a second, different, conductivity type from the first semiconductor region. In one such example, forming the second silicon layer can include forming a pre-doped silicon layer. In one example, forming the second silicon layer can include growing a p-type silicon layer over the second dielectric layer (e.g., a thin oxide layer).

Referring again to operation 402 of flowchart 400, the second dielectric layer and the second silicon layer can be formed on the back side, the front side and/or side edges of the substrate, where, in a subsequent patterning or cleaning process (e.g., operation 406) can be performed to remove the second dielectric layer and the second semiconductor layer from the front side and/or side edges of the substrate.

Referring to operation 404 of flowchart 400, forming a second semiconductor region can include forming a third dielectric layer on the second silicon layer. In an embodiment, the third dielectric layer can include a dopant layer. In one such embodiment, the dopant layer can have a second conductivity type. In one embodiment, the second conductivity type can be P-type. In one example, the dopant layer can be a layer of boron. In some embodiments, the second conductivity type can be N-type (e.g., a layer of phosphorus). In an embodiment, a deposition process can be performed to form the third dielectric layer (e.g., dopant layer). In one example, a low pressure chemical vapor deposition process can be used to deposit the third dielectric layer over the second silicon layer. In one embodiment, the third dielectric layer can include silicon oxide or silicon oxynitride. In an embodiment, the third dielectric layer can include an insulator and/or an insulating material.

Referring to operation 406 of flowchart 400, forming a second semiconductor region can include patterning the dopant layer and second silicon layer to form a second semiconductor region. In an embodiment, a lithographic or masking (e.g., screen printing, inkjet printing) and, subsequent to masking, an etch process can be used to pattern the dopant layer, second silicon layer and second thin dielectric layer. In another embodiment, a laser process (e.g., laser ablation, direct write, etc.) can be used in the patterning. In one embodiment, the patterning can also include etching process (e.g., wet chemical etching). In some embodiments, the patterning can also include a subsequent cleaning process. In an embodiment, the patterning can form a second semiconductor region of a second conductivity type (e.g., P-type). In some embodiments, the patterning or operation 406 need not be performed.

Referring to operation 408 of flowchart 400, where the third dielectric layer can include a dopant layer, forming a second semiconductor region can include performing a thermal process to drive dopants from the dopant layer to the second silicon layer. In an embodiment, the second conductivity type can be P-type. In one example, the dopant layer can be a layer of boron. In an example, the thermal process can include heating to a temperature approximately greater than or equal to 900 degrees-C to drive dopants from dopant layer to the second silicon layer. In some embodiments, the patterning or operation 406 can be performed subsequent to the thermal process or operation 408. In some embodiments, e.g., where the silicon layer is pre-doped or formed including a n-type or p-type conductivity type, the thermal process need not be performed.

Figure 5:
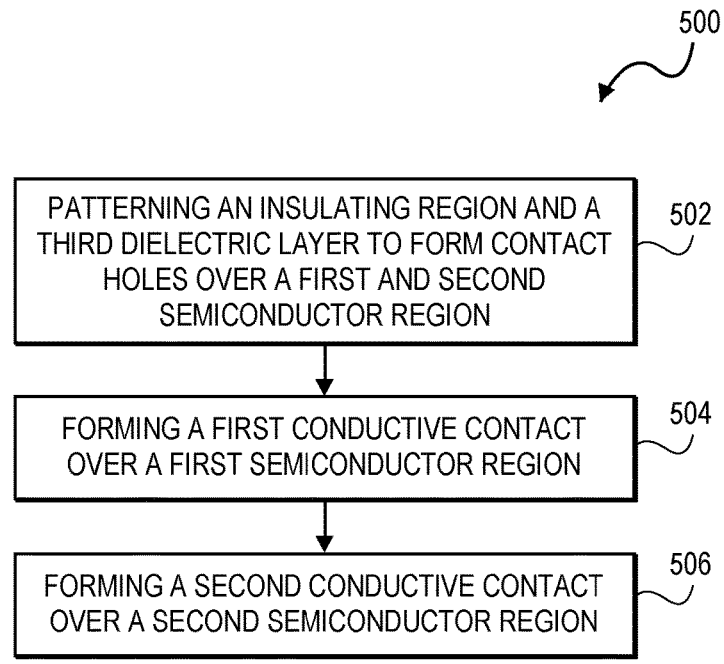
FIG. 5 is a flowchart listing operations in forming conductive contact structures for a solar cell, according to some embodiments.

Referring to FIG. 5, a flowchart 500 illustrating operations in forming conductive contact structures over a first and second semiconductor regions are shown, according to some embodiments. In various embodiments, the method described in FIG. 5 can include additional (or fewer) blocks than illustrated.

Referring to operations 502 of flowchart 500, forming a conductive contact structures over the first and second semiconductor regions can include patterning an insulating region and a third dielectric layer formed over the first and second semiconductor regions, respectively (e.g., as shown in flowcharts 200, 300 and 400 above). In an embodiment, patterning the insulating region and a third dielectric layer forms contact holes through the insulating region and the third dielectric layer. In an embodiment, the contact holes can be formed using a mask and etching process. In an example, a mask can be formed and a subsequent wet chemical etching process can be performed to form the contact holes. In some embodiments, a wet chemical cleaning processes can be performed to remove the mask. In one embodiment, the patterning can include performing a laser patterning process (e.g., laser ablation) to form contact holes in the insulating region and the third dielectric layer. In one embodiment the patterning process for forming contact holes in the insulating region and third dielectric layer can be performed in the same or single step (e.g., using a laser in a same or a single laser processing chamber) or, alternatively, can be performed separately (e.g., separate laser patterning processes can be used to form contact holes in the insulating region and third dielectric layer). In an embodiment, where the third dielectric layer can include a dopant layer, the patterning can include patterning the insulating region and the dopant layer to form contact holes through the insulating region and dopant layer in a single step or performed separately.

Referring to operations 504 of flowchart 500, forming a conductive contact over a first semiconductor regions can include forming a first conductive contact over a first semiconductor region. In an example, forming the forming a first conductive contact over a first semiconductor region can include forming a first conductive contact on a first polycrystalline silicon emitter region. In an embodiment, the first semiconductor region (e.g., first polycrystalline silicon emitter region) can have a first conductivity type (e.g., N-type). In an embodiment, the first conductive contact can be formed by one or more metallization processes. In an embodiment, the first conductive contact can have the same conductivity type as the first semiconductor region. In an example, the first conductive contact can be a N-type metal contact and the conductivity type of the first semiconductor region can be N-type. In another example, the first conductive contact can be a P-type metal contact and the conductivity type of the first semiconductor region can be P-type.

Referring to operations 506 of flowchart 500, forming a conductive contact over a second semiconductor regions can include forming a second conductive contact over a second semiconductor. In an example, forming the forming a second conductive contact over a second semiconductor region can include forming a second conductive contact on a second polycrystalline silicon emitter region. In an embodiment, the second semiconductor region (e.g., second polycrystalline silicon emitter region) can have a second conductivity type (e.g., P-type). In an embodiment, the second conductive contact can be formed by one or more metallization processes. In an embodiment, the second conductive contact can have the same conductivity type as the second semiconductor region. In an example, the second conductive contact can be a P-type metal contact and the conductivity type of the second semiconductor region can also be P-type. In another example, the second conductive contact can be a N-type metal contact and the conductivity type of the second semiconductor region can be N-type.

Referring again to operations 504, 506 of flowchart 500, forming the first and second conductive contacts can include performing a sputtering process, locally depositing a metal, a blanket deposition process, a plating process, bonding a metal foil and/or bonding wires to form a first and the second semiconductor regions (e.g., as described above). In an example, the first and second conductive contacts can include a locally deposited aluminum, aluminum foil and/or an aluminum wire. In one embodiment, a thermal compression process can be used to electrically connect the first and second conductive contacts to the first and second semiconductor regions (e.g., (e.g., first and second polycrystalline silicon emitter region). In an example, a thermal compression process can be used to adhere a wire or a plurality of wires to the first and second semiconductor regions. In one embodiment, a metal foil can be bonded (e.g., welded) to the first and semiconductor regions. In an embodiment, forming the first and second conductive contacts can include performing a blanket deposition process. In an example, forming the first and second conductive contacts can include performing an electroplating process. In some examples, forming the first and second conductive contacts can include performing a blanket deposition process to form a metal seed layer. In the same example, a plating process can be subsequently performed to plate metals to the metal seed layer. In the same example, a patterning process can be performed after forming the metal seed layer and performing the plating process to form the first and second conductive contacts.

Referring again to operations 504, 506 of flowchart 500, the methods described above can be used in the operations of 504 and 506 separately or in a same or single process step. In an example, forming the first and second conductive contacts using a plating process can include placing the substrate in a bath to plate metal to the substrate and form the first and second conductive contacts. In another embodiment, a local metal deposition process can be used to form the first and second conductive contacts in one process step. In one embodiment, wires can be placed and thermally bonded to the first conductive contact and to the second conductive contact. In an embodiment, wires can be placed and thermally bonded to the first and second conductive contacts in a same or a single process step.

Disclosed herein are methods of fabricating solar cells. In an exemplary process flow, FIGS. 6-16 illustrate cross-sectional views of various stages in the fabrication of a solar cell, according to some embodiments. In various embodiments, the methods of FIGS. 6-16 can include additional (or fewer) blocks than illustrated. For example, in some embodiments, the patterning processes of FIGS. 14 and 15 may instead be combined into a single patterning process or performed in a same or single processing step.

Figure 6:
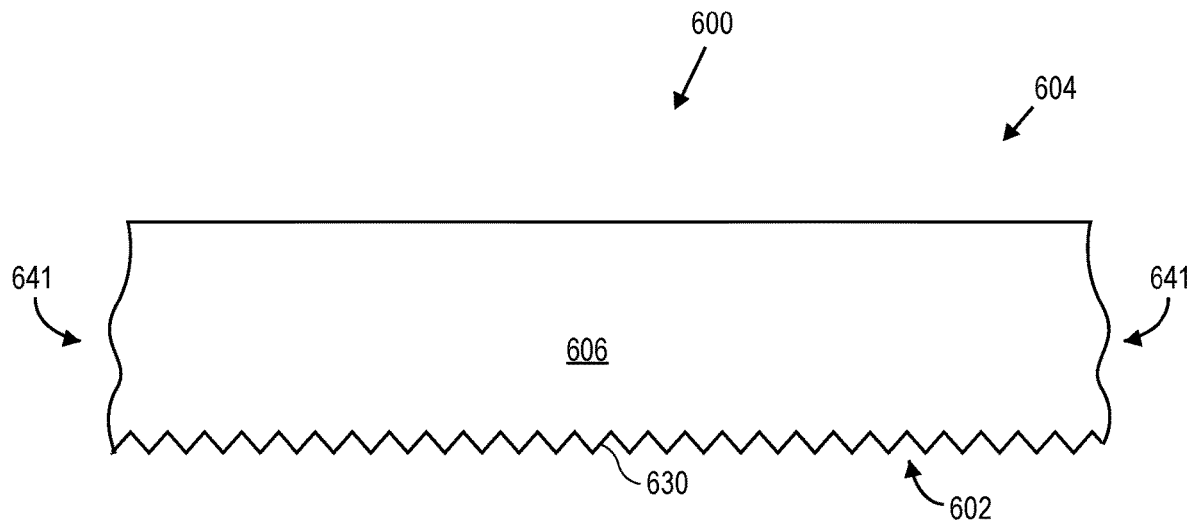
FIGS. 6-16 illustrate cross-sectional views of various stages in the fabrication of a solar cell, according to some embodiments.
Figure 7:
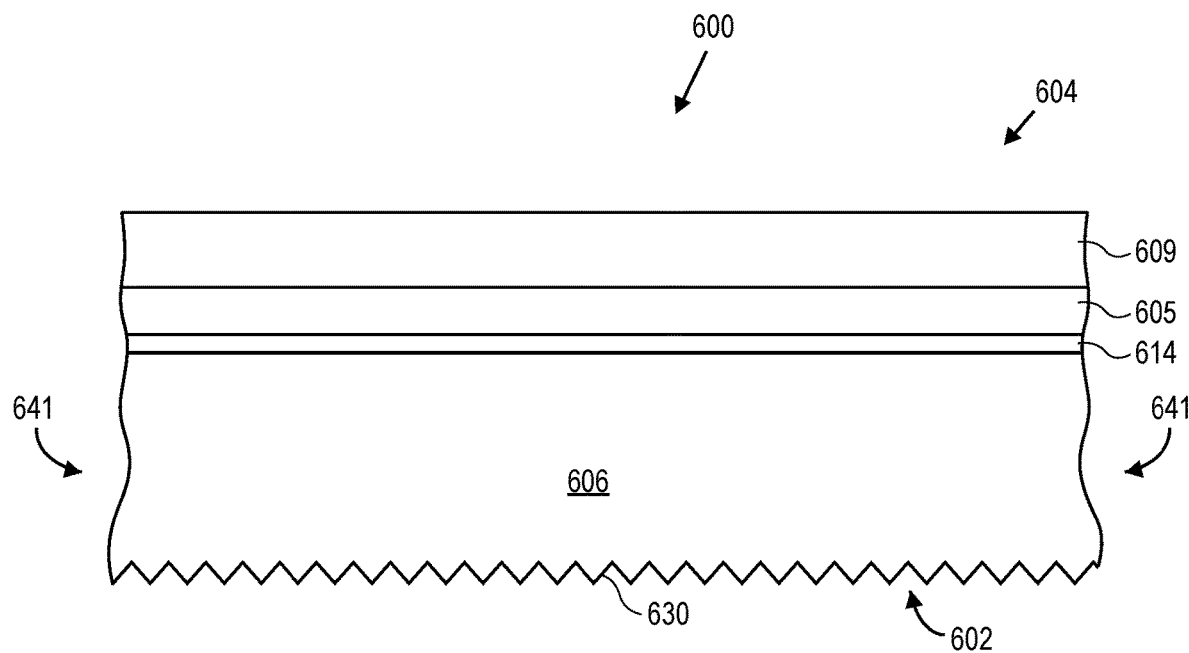

Referring to FIG. 6, a method of fabricating a solar cell 600 can include performing a texturization process to form a textured surface 630 on a front side 602 of substrate 606. In an embodiment, the substrate 606 is a silicon substrate. In an example, the substrate 606 can be a monocrystalline silicon substrate, such as a bulk single crystalline N-type doped silicon substrate. In another example, the substrate 606 can be as a bulk single crystalline P-type doped silicon substrate. It is to be understood, however, that substrate 606 may be a layer, such as a multi-crystalline silicon layer, disposed on a global solar cell substrate. In an embodiment, the substrate 606 can have a front side 602 and a back side 604, where the front side 602 is opposite the back side 604. In one embodiment, the front side 602 can be referred to as a light receiving surface 602 and the back side can be referred to as a back surface 604. In an embodiment, the substrate 606 can also have side edges 641, e.g., edges of a wafer or the substrate, as shown.

Referring again to FIG. 6, in an embodiment, performing a texturization process can include using a hydroxide-based wet etchant to form a texturized surface 630 on the front side 602 of the substrate 606. A texturized surface 630 may be one which has a regular or an irregular shaped surface for scattering incoming light, decreasing the amount of light reflected off the light-receiving and/or exposed surfaces of the solar cell 600. In an embodiment, as shown in FIG. 6, a singled sided texturization process can be performed to form a texturized surface 630 on the front side 602 of the substrate 606. In an embodiment, the texturization process may be performed on the front side 602 and the back side 604 of substrate 600. In one such embodiment, prior to or within the same or single process step of the texturization process, the substrate can be cleaned, polished, planarized and/or thinned. In some embodiments, the texturization process need not be performed.

Referring again to FIG. 6, in an embodiment, although the texturization process is shown to be performed at the start of the process flow, the texturization process can also be performed in the middle, or at the end of the method described herein. For example, texturization process can be performed subsequent to the processes described in FIG. 15.

Referring to FIG. 6, in an embodiment, a method of fabricating a solar cell 600 can include forming a first dielectric layer 614 on the back side 604 of the substrate 606. In an embodiment, the first dielectric layer 614 can be formed in an oxidation process. In one embodiment, the first dielectric layer 614 can be formed in a deposition process. In an embodiment, the first dielectric layer 614 is a thin oxide layer, a silicon oxide layer or silicon oxynitride layer. In an embodiment, the first dielectric layer 614 can have a thickness of approximately 2 nanometers or less. In an embodiment, the first dielectric layer 614 is a tunnel oxide layer.

Referring again to FIG. 7, in an embodiment, a method of fabricating a solar cell 600 can include forming a first silicon layer 609 on the first dielectric layer 614. In an embodiment, the first silicon layer 605 can be a polycrystalline silicon layer. In an embodiment, the first silicon layer 605 can be doped to have a first conductivity type either through in situ doping, post a low pressure chemical deposition process, deposition implanting, or a combination thereof. In a specific embodiment, the first conductivity type is N-type (e.g., formed using phosphorus atoms or arsenic impurity atoms). In another embodiment, the first silicon layer 609 can be formed undoped. In one such embodiment, a dopant layer can be formed on the first silicon layer 609 and a thermal process can be performed to drive dopants from the dopant layer into the first silicon layer 609 resulting in a first silicon layer having a first conductivity type (e.g., n-type or p-type).

Referring once again to FIG. 7, in an embodiment, the first silicon layer 605 can be an amorphous silicon layer such as a hydrogenated silicon layer represented by a-Si:H which is implanted with dopants of the first conductivity type subsequent to deposition of the amorphous silicon layer. In one such embodiment, the first silicon layer 605 can be subsequently annealed (at least at some subsequent stage of the process flow) to ultimately form a polycrystalline silicon layer. In an embodiment, for either a polycrystalline silicon layer or an amorphous silicon layer, if post deposition implantation can be performed, the implanting is performed by using ion beam implantation or plasma immersion implantation. In one such embodiment, a shadow mask can be used for the implanting. In an embodiment, the first silicon layer 605 can have a thickness greater than or equal to approximately 300 Angstroms.

Referring again to FIG. 7, an insulator layer 609 can be formed on the first silicon layer 605. In an embodiment the insulator layer 609 can include silicon dioxide. In an example, a deposition process can be performed to form the insulator layer 609. In an example, a blanket deposition process can be performed to form the insulator layer 609.

Figure 8:
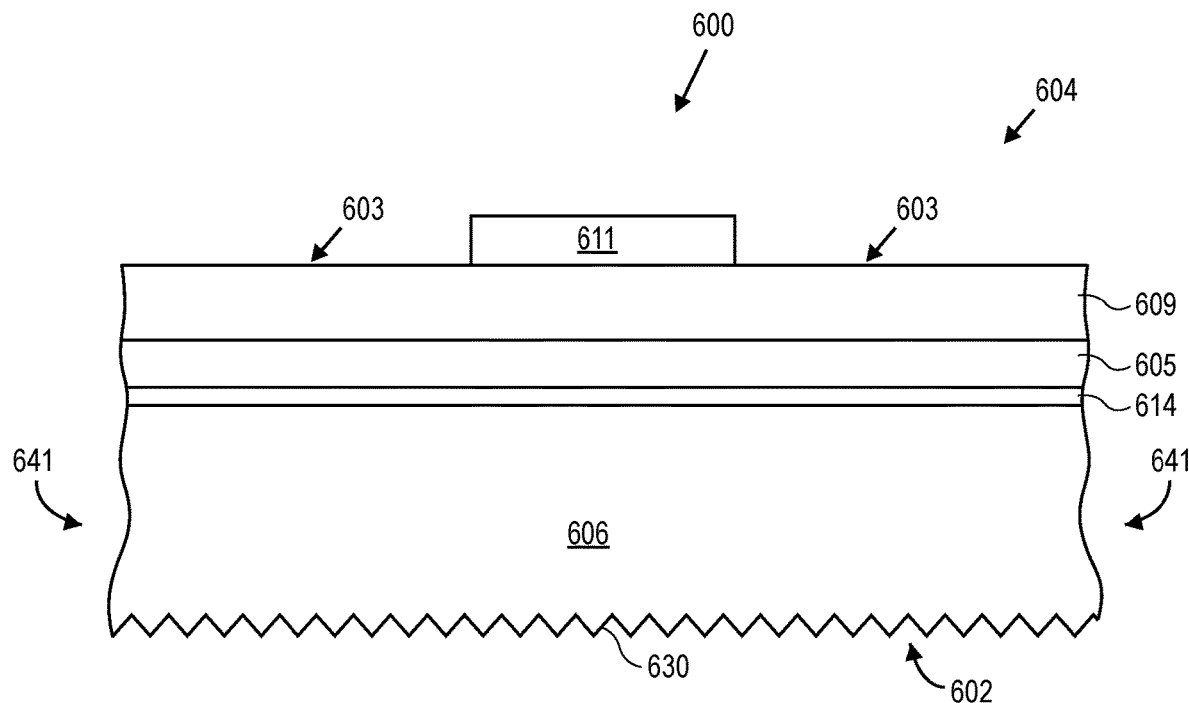
Figure 9:
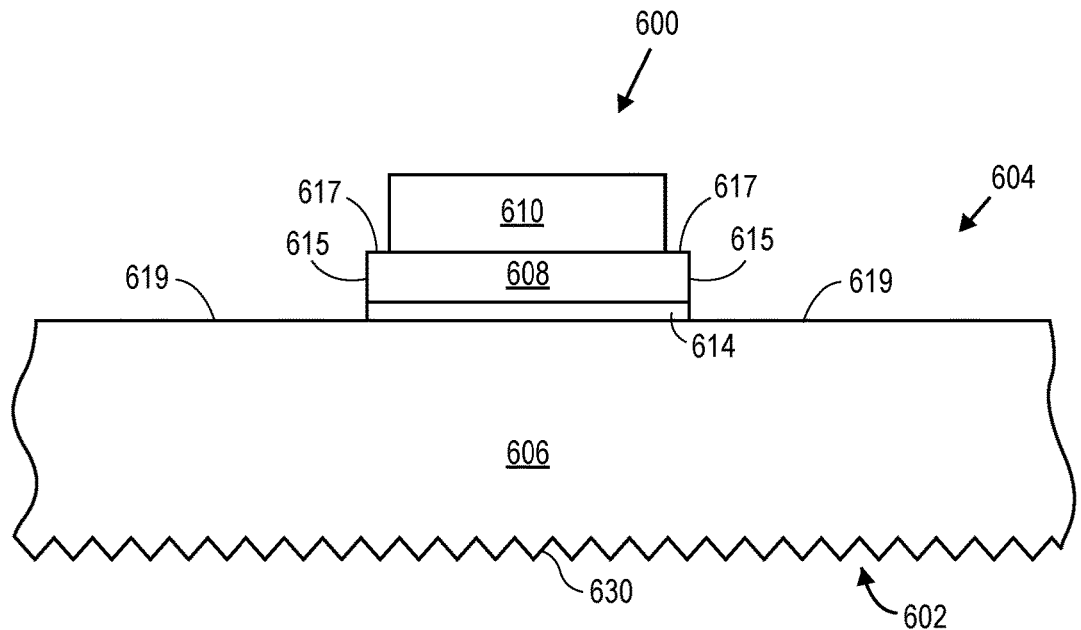

Referring to FIG. 8, a method of fabricating a solar cell 600 can include patterning the insulator layer 609, first silicon layer 605 and first dielectric layer 614. In an embodiment, the patterning can include forming a mask 611 over the insulator layer 609, first silicon layer 605 and first thin dielectric layer 614. In an example, the mask 611 can be formed using a screen printing, inkjet printing and/or any applicable masking process. In an embodiment, the mask 611 can be patterned to protect portions and expose other portions 603 of the insulator layer 609, first silicon layer 605 and first dielectric layer 614 during an etching process. After etching, the mask 611 can be subsequently removed. For example, a lithographic or screen print masking and subsequent wet chemical etch process can be used to pattern the insulator layer 609, first silicon layer 605 and first dielectric layer 614 and subsequently remove the mask 611 (e.g., in a cleaning step). In another embodiment, a laser process (e.g., laser ablation, direct write) can be used to pattern the insulator layer 609, first silicon layer 605 and first thin dielectric layer 614. FIG. 9 shows a first semiconductor region 608, insulating region 610 and first dielectric layer 614 following the patterning processes described in FIG. 8 above.

Referring again to FIG. 8, in one embodiment, the first dielectric layer 614 and the first silicon layer 605 can be formed on the back side 604, the front side 602 and/or side edges 641 of the substrate, where, a subsequent patterning or cleaning process can be performed to remove the first dielectric layer 614 and the first silicon layer 605 from the front side 602 and/or side edges 641 of the substrate 606.

Referring to FIG. 9, an insulating region 610, a first semiconductor region 608 and first dielectric layer 614 is shown subsequent to the patterning process of FIG. 8, according to some embodiments. In an embodiment, as described above, the first semiconductor region can be a first polycrystalline silicon emitter region. In a specific embodiment, the first semiconductor region 608 can have a first conductivity type which is N-type (e.g., formed using phosphorus atoms or arsenic impurity atoms). In some embodiments, the first semiconductor region 608 can have a first conductivity type which is P-type. In an embodiment, the insulating region 610 can be include silicon dioxide. In some embodiments, the insulating region 610 can include other insulating materials e.g., a polyimide. As shown in FIG. 9, portions 615, 617 of the first semiconductor region 608 can be exposed subsequent to the patterning process (e.g., masking and etching, laser patterning, etc.) described in FIG. 9. Similarly, also shown, portions 619 of the substrate 606 can also be exposed subsequent to the patterning.

In contrast to the processes shown in FIG. 8 and FIG. 9, other patterning process can be used. For example, the mask 611 from FIG. 8 need not be formed. In one example, a laser patterning process (e.g., without a mask 611) can be used to pattern the insulator layer 609, first silicon layer 605 and first thin dielectric layer 614.

Figure 10:
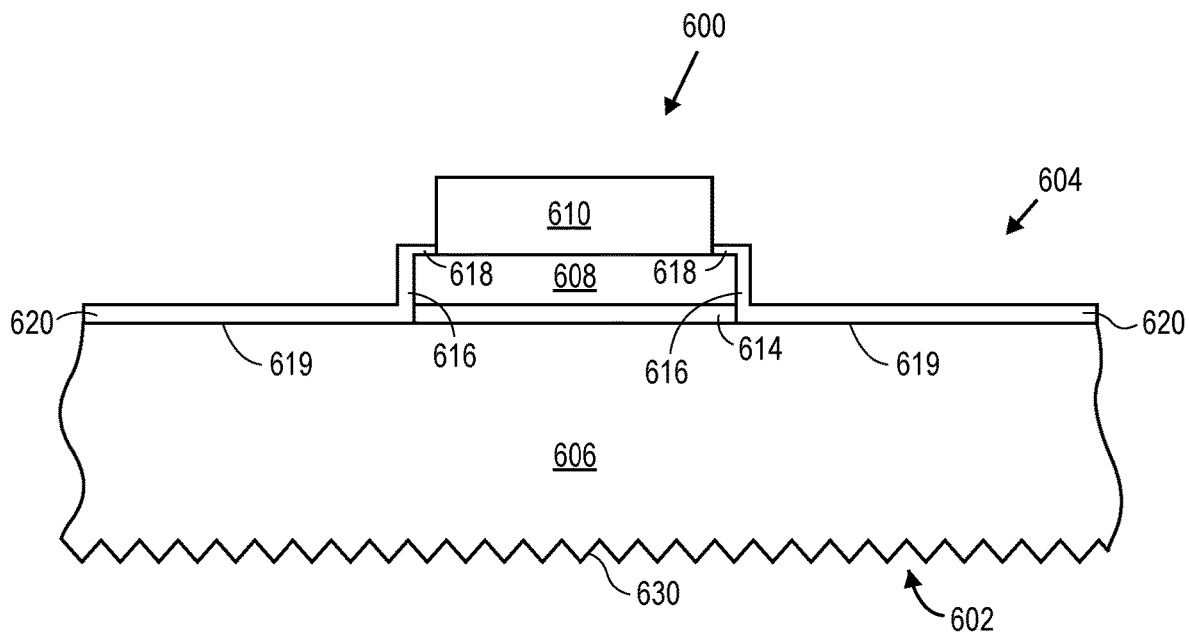
Figure 11:
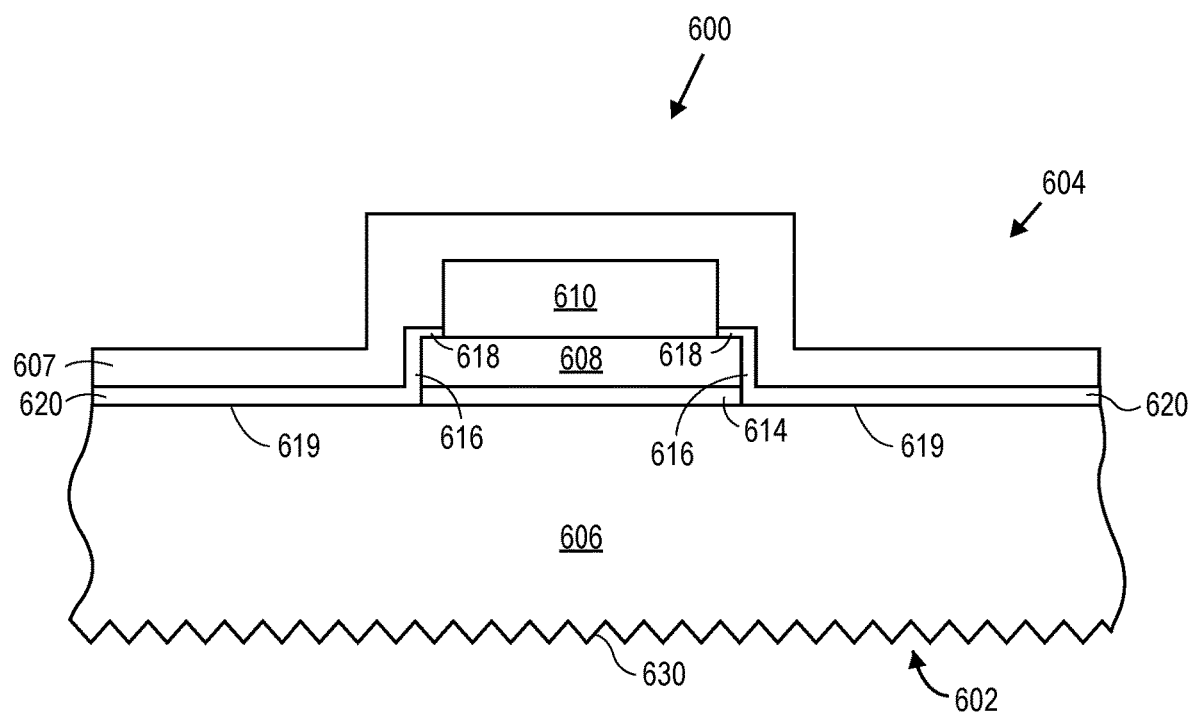

Referring to FIG. 10, a method of fabricating a solar cell 600 can include forming a second dielectric layer 620 on portions of the first semiconductor region 608 and on portions of the substrate 606. In an embodiment, the second dielectric layer 620 can be formed in an oxidation process and is a thin oxide layer such as a tunnel dielectric layer (e.g., silicon oxide). In one embodiment, the second dielectric layer 620 can be formed in a deposition process. In an embodiment, the second dielectric layer 620 is a thin oxide layer or silicon oxynitride layer. In an embodiment, the second dielectric layer 620 can have a thickness of approximately 2 nanometers or less. Referring to FIGS. 9 and 10, in an embodiment, the second dielectric layer 620 can be formed 616, 618 over exposed portions 615, 617 of the first semiconductor region 608. Similarly, the second dielectric layer 620 can be formed over exposed portions 619 of the substrate 606. As used herein, the second dielectric layer 620 can also be referred to as a second thin dielectric layer.

Referring again to operation 208 of flowchart 200, in an embodiment, forming the second dielectric layer on portions of the first semiconductor region 608 can instead include forming a separate, different and/or distinct dielectric layer 616, 618 on portions of the first semiconductor region 608. In an example, forming the second dielectric layer on portions of the first semiconductor region can instead include forming another dielectric layer 616, 618 on portions of the first semiconductor region 608. In an embodiment, this dielectric layer 616, 618 can be referred to as a fourth or a fifth dielectric layer which is separate and different from the second dielectric layer 620.

Referring once again to FIG. 11, a method of fabricating a solar cell 600 can include forming a second silicon layer 607 over the back side 604 of the substrate 606. In an embodiment, forming the second silicon layer 607 over the back side 604 of the substrate 606 can include forming the second silicon layer 607 on or over the second dielectric layer 620 and on the insulating region 610. In one embodiment, the second silicon layer 607 can be deposited over the second dielectric layer 620. In one example, a low pressure chemical vapor deposition (LPCVD) process or a plasma enhanced chemical vapor deposition (PECVD) process can be used to deposit the silicon layer 607. In an embodiment, the second silicon layer 607 can be a polycrystalline silicon. In one embodiment, processes if FIGS. 10 and 12 can be performed in a single chamber and/or manufacturing step. In an example, a second dielectric layer 620 can be grown and, subsequently, the second silicon layer 607 can be deposited over the second dielectric layer 620 in the same or single process chamber and/or manufacturing process. In an embodiment, the second silicon layer 607 can be formed undoped. In an embodiment, the second silicon layer 607 can be an amorphous silicon layer. In one such embodiment, the amorphous silicon layer is formed using low pressure chemical vapor deposition (LPCVD) or plasma enhanced chemical vapor deposition (PECVD). In an embodiment, the second silicon layer 607 can have a thickness greater than or equal to approximately 300 Angstroms.

Referring again to FIG. 11, in an embodiment, a method of fabricating a solar cell 600 can include forming a second silicon layer 607 having a second, different, conductivity type from the first semiconductor region 608. In one such example, forming the second silicon layer 607 can include forming a pre-doped silicon layer. In one example, forming the second silicon layer 607 can include growing a p-type silicon layer over the second dielectric layer (e.g., a thin oxide layer).

Figure 12:
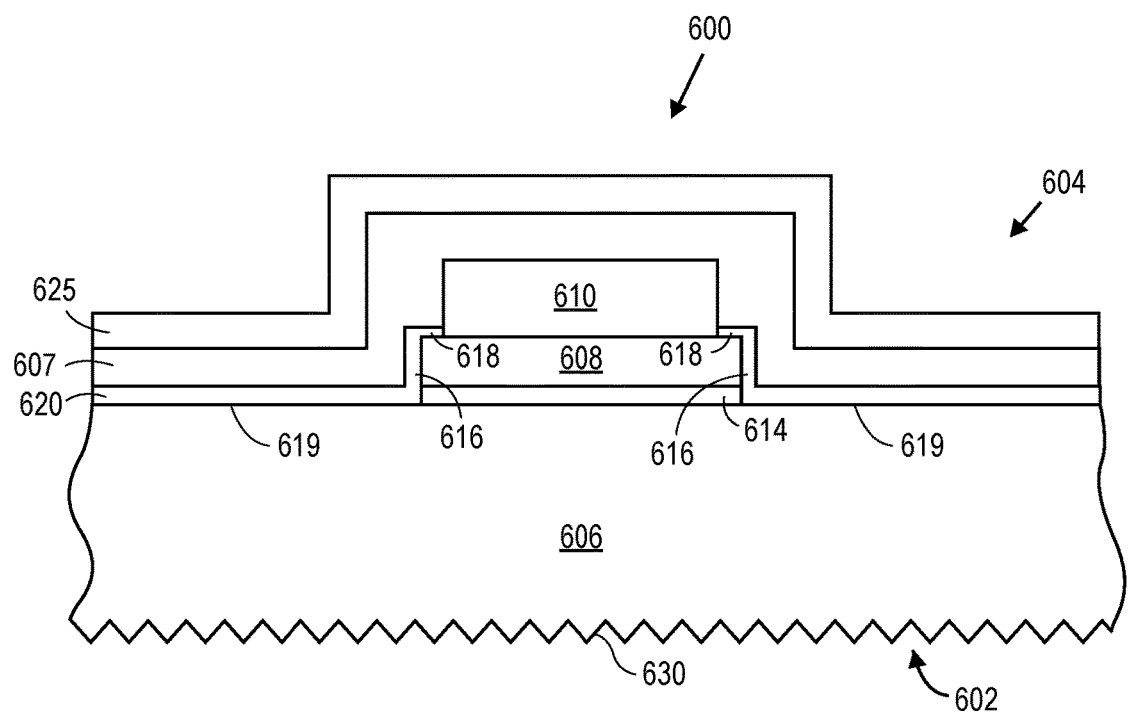

Referring to FIG. 12, a method of fabricating a solar cell 600 can include forming a third dielectric layer 625 over the back side of the substrate. In an embodiment, forming the third dielectric layer can include forming the third dielectric layer on the second silicon layer 607 and the insulating region 610. In one embodiment, the third dielectric layer 625 can include silicon oxide, silicon oxynitride and silicon nitride. In an embodiment, the third dielectric layer 625 can be a dopant layer. In one such embodiment, the dopant layer 625 can have a second conductivity type. In an embodiment, the second conductivity type can be P-type. In one example, the dopant layer 625 can include boron. In an embodiment, a deposition process can be performed to form the dopant layer 625. In an example, a chemical vapor deposition process can be used to from the dopant layer 625. In one embodiment, the dopant layer can have a thickness in the range of approximately 100-2000 Angstroms. In an embodiment, the dopant layer 625 has a conductivity type which is opposite to the conductivity type of the the first semiconductor region 608.

Figure 13:
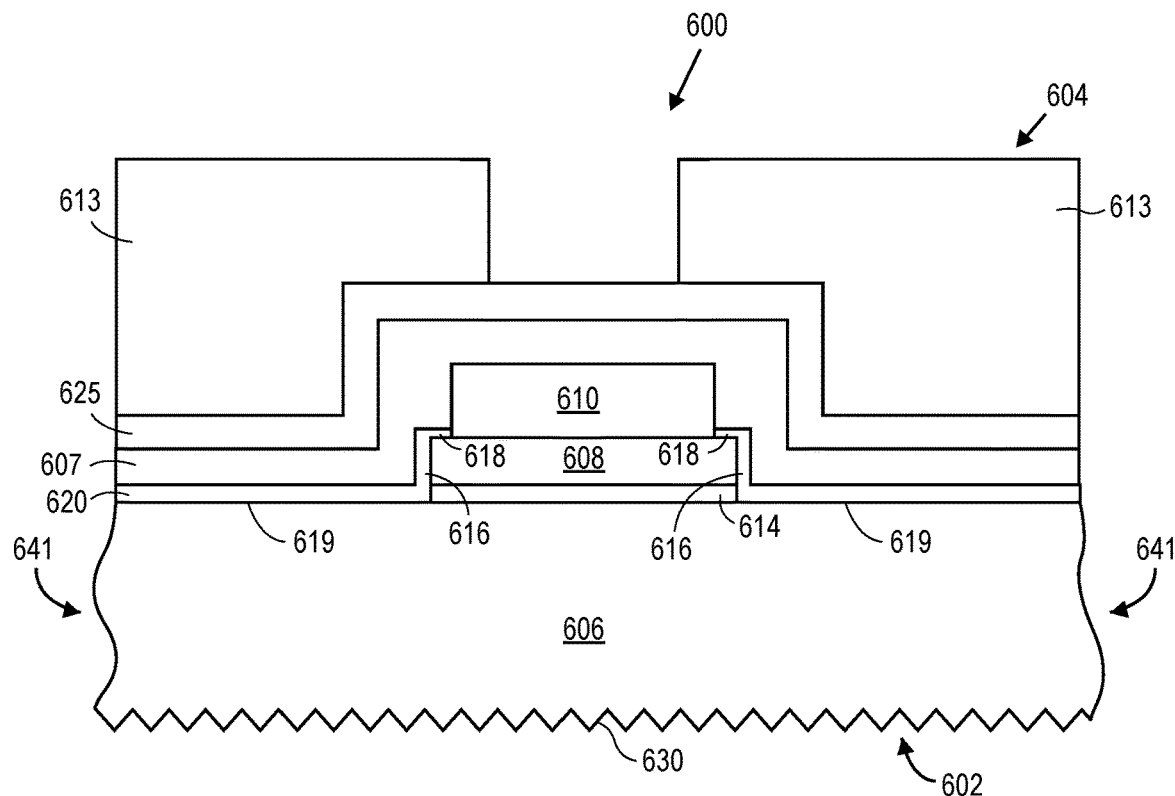

Referring to FIG. 13, a method of fabricating a solar cell 600 can include patterning a third dielectric layer and a second silicon layer to form a second semiconductor region. As described herein, in an embodiment, patterning the third dielectric layer can include patterning a dopant layer (e.g., where the third dielectric layer includes a dopant or a dopant layer). In an embodiment, the patterning can include forming a mask 613 over the dopant layer 625. In an embodiment, the mask 613 can be patterned to protect portions of the dopant layer 625, second silicon layer 607 and second thin dielectric layer 620 during an etching process. After etching, the mask 613 can be subsequently removed. For example, a lithographic or screen print masking and subsequent wet chemical etch process can be used to pattern the dopant layer 625 and second silicon layer 607. In another embodiment, a laser patterning process (e.g., laser ablation, direct write) can be used to pattern the dopant layer 625, second silicon layer 607 and second thin dielectric layer 620. The structure shown in FIG. 14 shows a second semiconductor region 612 formed following the patterning processes described in FIG. 13 above.

Referring again to FIG. 13, in one embodiment, the second dielectric layer 620 and the second silicon layer 607 can be formed on the back side 604, the front side 602 and/or side edges 641 of the substrate 606, where, a subsequent patterning or cleaning process can be performed to remove the second dielectric layer 620 and the second silicon layer 607 from the front side 602 and/or side edges 641 of the substrate 606.

Figure 14:
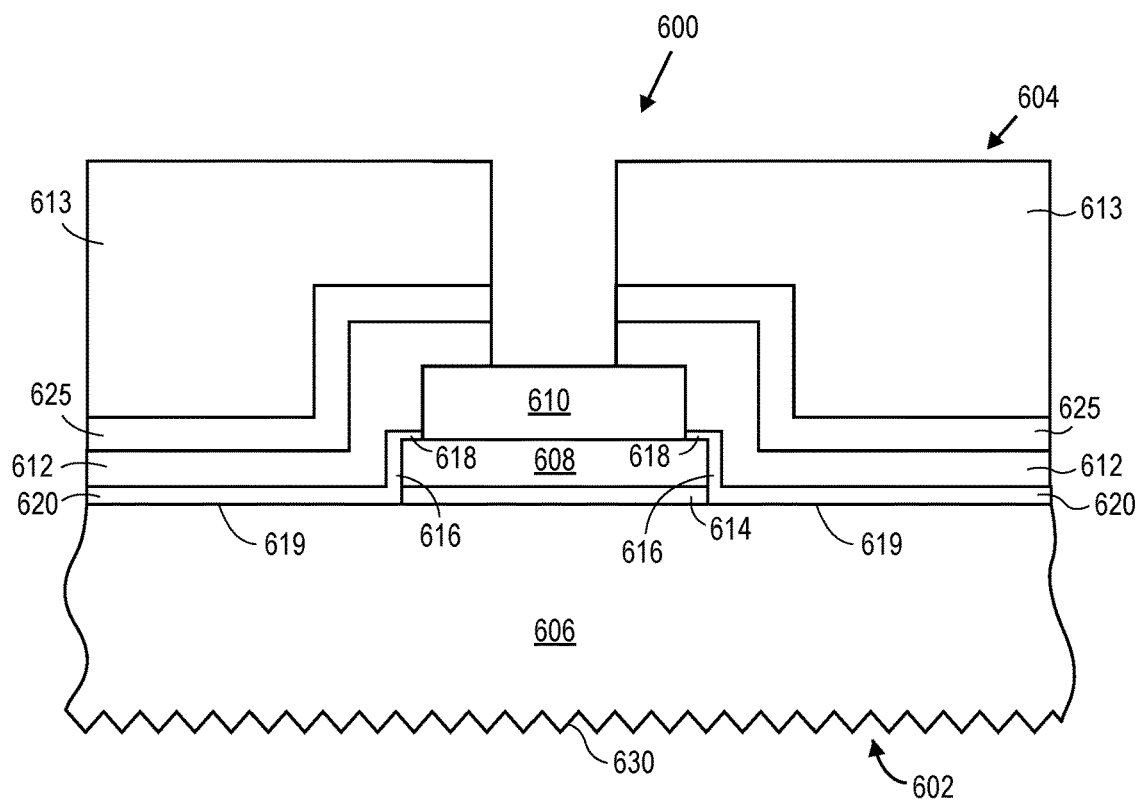

In contrast to the processes shown in FIG. 13 and FIG. 14, other patterning process can be used. For example, the mask 613 from FIGS. 13 and 14 need not be formed. In one example, a laser patterning process (e.g., without a mask 613) can be used to pattern the dopant layer 625 and second silicon layer 607 of FIG. 13.

Referring to FIG. 14, a portion of the insulating region 610 from FIG. 13 can be exposed, e.g., between the mask portion 613, subsequent to the patterning process described in FIG. 13. Also, although not shown, the mask 613 can be removed. In an example, subsequent to a patterning of FIGS. 13 and 14, the mask 613 can removed by a cleaning process. In an example, a wet chemical clean or ink strip process can be used to remove the mask 613.

Referring still again to FIG. 13 and FIG. 14, where the third dielectric layer can include a dopant layer, a method of fabricating a solar cell 600 can include performing a thermal process to drive dopants from dopant layer 625. In the same embodiment, the mask portion 613 from FIG. 13 and FIG. 14 can be removed prior to performing the thermal process. In an embodiment, subsequent to the thermal process, the second silicon layer 612 can have the same conductivity type as the dopant layer 625. In one such embodiment, the second conductivity type can be P-type. In an example, the thermal process can include heating to a temperature greater than or equal to approximately 900 degrees-C. In an embodiment, the heating temperature can be approximately within the range of 900-1100 degrees-C. In another embodiment, a laser doping process can be used to drive dopants from dopant layer 625 to the second silicon layer 607. In an embodiment, the thermal process can be performed subsequent to the patterning and/or cleaning processes described above.

Referring again to FIG. 13 and FIG. 14, a method of fabricating a solar cell 600 can include forming a second semiconductor region 612 subsequent to the thermal process described above, according to some embodiments. In an embodiment, the second semiconductor region 612 can be a second polycrystalline silicon emitter region. In one embodiment, the second semiconductor region 612 can have a second conductivity type. In an embodiment, the second semiconductor region 612 can have the same conductivity type as the third dielectric layer 625, e.g., where the third dielectric layer includes dopant (e.g., a dopant layer). In one embodiment, the second conductivity type is P-type. In an embodiment, the second conductivity type can be N-type. In one embodiment, second semiconductor region can be a pre-doped polycrystalline silicon emitter regions. In one such example, the second semiconductor region can be formed including an n-type or p-type conductivity directly, where the third dielectric layer does not include a dopant layer or the third dielectric layer is not formed altogether.

Figure 15:
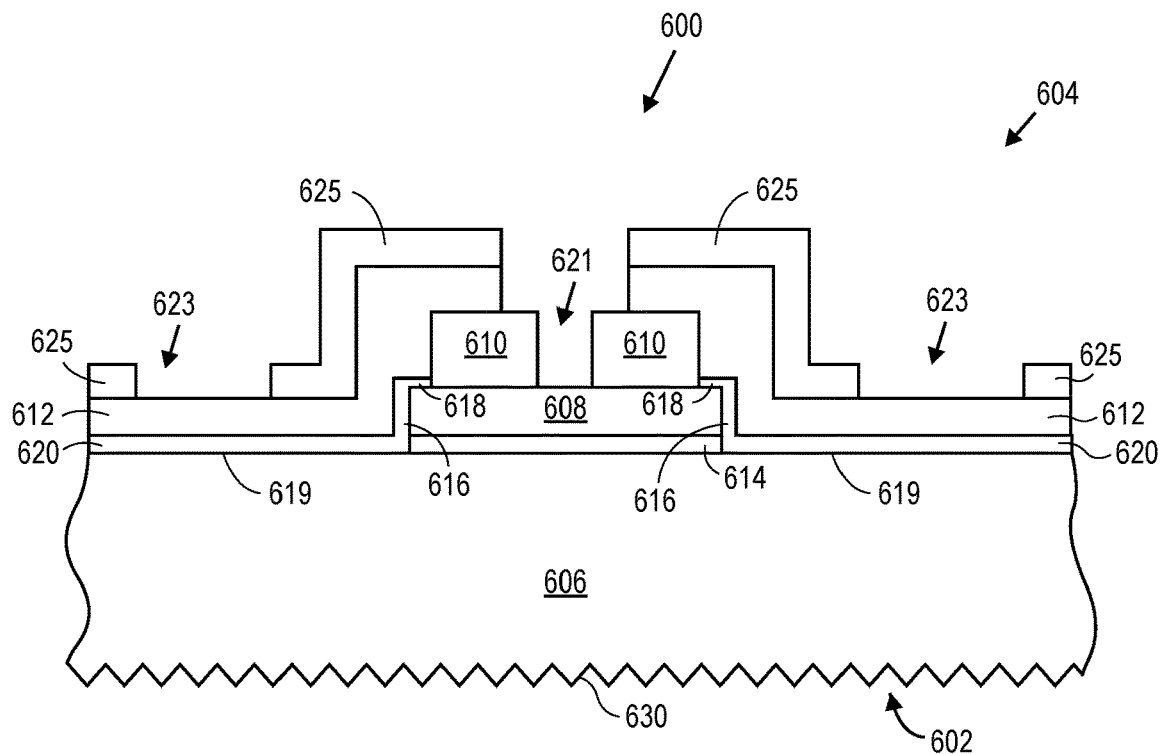

Referring to FIG. 15, a method of fabricating a solar cell 600 can include patterning the insulating region 610 and a third dielectric layer (e.g., in some embodiments a dopant layer) 625 to form contact holes 621, 623 through the insulating region 610 and a dopant layer 625. In an embodiment, the patterning can form a contact hole 621 over the first semiconductor region 608. In an embodiment, the patterning can form a contact hole 623 over the second semiconductor emitter region 612. In an embodiment, the contact holes can be formed using a mask and etching process, laser process, or any other applicable patterning process.

Figure 16:
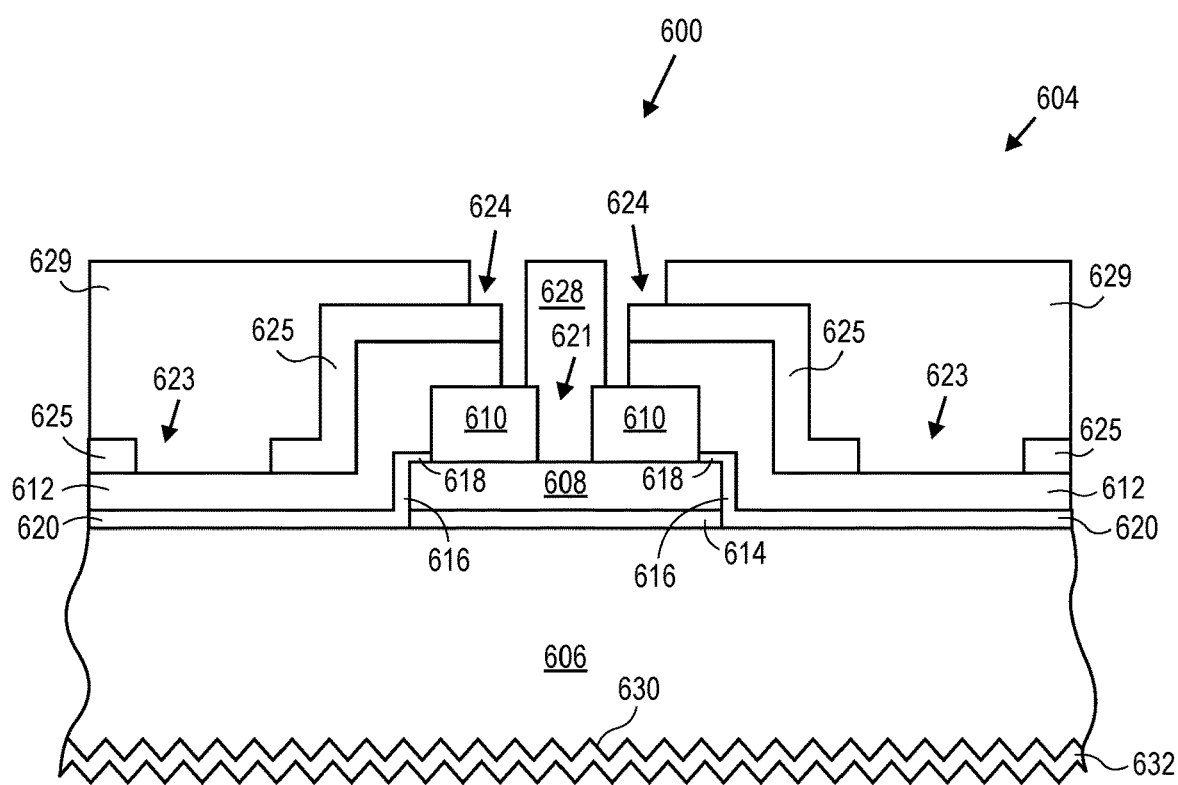

Referring to FIG. 16, a method of fabricating a solar cell 600 can include forming a first conductive contact 638 over the first semiconductor region 608. In an embodiment, the first conductive contact 638 can be formed by one or more metallization processes. In an example, the first conductive contact 638 can be formed by performing a sputtering process, locally depositing a metal, a blanket deposition process, a plating process, bonding a metal foil and/or performing a wire bonding process. In an embodiment, the first conductive contact 638 can have the same conductivity type as the first semiconductor region 608 (e.g., first polycrystalline silicon emitter region). In an example, the first conductive contact 638 can be a N-type metal contact and the conductivity type of the first semiconductor region 608 can also be N-type.

Referring again to FIG. 16, a method of fabricating a solar cell 600 can include forming a second conductive contact 639 over a second semiconductor region. In an embodiment, the second conductive contact 639 can be formed by one or more metallization processes. In an example, the second conductive contact 639 can be formed by performing a sputtering process, locally depositing a metal, a blanket deposition process, a plating process, bonding a metal foil and/or performing a wire bonding process. In an embodiment, the second conductive contact 639 can have the same conductivity type as the second semiconductor region 612 (e.g., second polycrystalline silicon emitter region). In an example, the second conductive contact can be a P-type metal contact and the conductivity type of the second semiconductor region can also be P-type. In an embodiment, as shown at 624, the second conductive contact can be formed over the first semiconductor region and the second semiconductor region. In contrast, in some embodiments, the second conductive contact can be formed over the second semiconductor region only. In an embodiment, the second conductive contact 639 can be formed over the third dielectric layer 625 and the second semiconductor region 612. In one example, the second conductive contact 639 can be formed over a dopant layer and the second semiconductor region 612 (e.g., the dopant layer disposed on the second semiconductor region 612).

Referring again to FIG. 16, in an embodiment, the first and second conductive contacts 638, 639 can include one or more metals and/or metal alloys. In an example, the first and second conductive contacts 638, 639 can include aluminum, titanium tungsten, nickel and/or copper, among other metals. In an embodiment, the first and second conductive contacts 638, 639 can include one, two or more layers of metal. In an example, the metal seed layer can include a first layer including copper, a second layer including tungsten and a third layer including aluminum. In an example, the first and second conductive contacts 638, 639 can include a locally deposited aluminum, aluminum foil, an aluminum wire, a blanket deposited metal (e.g., metal seed layer) and/or a plated metal.

Referring once more to FIG. 16, a fourth dielectric layer 632 can be formed on the front side 602 of the solar cell 600. In an embodiment the fourth dielectric layer 632 can be an anti-reflective layer (ARC). In one example, the fourth dielectric layer 632 can include silicon nitride. In some embodiments, other layers can be formed over the front side 602. In an example, an amorphous silicon layer or another polysilicon layer can be formed over the front side 602.

Referring once again to FIG. 16, a solar cell 600 is shown fabricated using the methods corresponding to the flowcharts 200, 300, 400 and 500 of FIGS. 2, 3, 4 and 5 and the methods of FIGS. 6-16. As shown, the solar cell of Figures 600 of FIG. 16 has similar reference numbers to elements of the solar cell 100 of FIG. 1, where like reference numbers refer to similar elements throughout the figures. In an embodiment, the structure of the solar cell 600 of FIG. 16 is substantially similar to the structure of the solar cell 100 of FIG. 1, except as described above. Therefore, the description of corresponding portions of FIG. 1 applies equally to the description of FIG. 16. In an example, the first semiconductor region 608 of FIG. 16 can correspond to the first semiconductor region 108 of FIG. 1. In one example, the third dielectric layer 625 of FIG. 16 can correspond to the third dielectric layer 125 of FIG. 1. As disclosed above, the third dielectric layer 625 can include a dopant layer. In some embodiments, the third dielectric layer 625 can include silicon oxide or silicon oxynitride. In one embodiment, the third dielectric layer 625 can include an insulator layer or an insulating material. In one embodiment, a portion at 624 of the second semiconductor region 612 can be disposed between the first conductive contact 628 and second conductive contact 629. In an embodiment, a portion at 624 of the third dielectric layer 625 can be also disposed between the first conductive contact 628 and second conductive contact 629.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
 a first dielectric layer disposed on a back side of a substrate;
 a first semiconductor region disposed on the first dielectric layer;
 an insulating layer disposed on the first semiconductor region, the insulating layer having a vertical thickness;
 a second dielectric layer disposed on portions of the first semiconductor region and on portions of the back side of the substrate;
 a second semiconductor region disposed on the second dielectric layer, wherein a portion of the second dielectric layer is disposed between the first and second semiconductor regions;
 a third dielectric layer disposed on the second semiconductor region;
 a first conductive contact disposed over the first semiconductor region but not disposed over the third dielectric layer, wherein the first conductive contact is disposed through the insulating layer, wherein the first conductive contact is in direct contact with a top surface of the insulating layer, and wherein the first conductive contact has an upper wide portion and a lower narrow portion, the upper wide portion having a greater vertical thickness greater than a vertical thickness of the lower narrow portion, and the vertical thickness of the lower narrow portion of the first conductive contact has the same vertical thickness of the insulating layer; and a second conductive contact disposed over the third dielectric layer and second semiconductor region, wherein the second conductive contact is disposed through the third dielectric layer, and wherein the second conductive contact is laterally retracted from the third dielectric layer.

2. The solar cell of claim 1, wherein the third dielectric layer comprises an insulator layer.

3. The solar cell of claim 1, wherein the third dielectric layer comprises a dielectric selected from the group consisting of silicon oxide, silicon oxynitride and silicon nitride.

4. The solar cell of claim 1, wherein a portion of the second semiconductor region and a portion of the third dielectric layer are disposed between the first and second conductive contact structures.

5. The solar cell of claim 1, wherein a portion of the second semiconductor region and a portion of the third dielectric layer are disposed over the first semiconductor region.

6. The solar cell of claim 1, wherein the first and second conductive contacts each comprises a metal foil or a wire.

7. The solar cell of claim 1, wherein the second conductive contact is disposed over the first and second semiconductor regions.

8. The solar cell of claim 1, wherein the first and second semiconductor regions comprise a first and second polycrystalline silicon emitter regions.

* * * * *